(12) United States Patent
Walter et al.

(10) Patent No.: US 10,771,193 B2
(45) Date of Patent: Sep. 8, 2020

(54) CHANNEL ADAPTIVE ERROR-DETECTING CODES WITH GUARANTEED RESIDUAL ERROR PROBABILITY

(71) Applicant: Siemens Aktiengesellschaft, Munich (DE)

(72) Inventors: Maximilian Walter, Nuremberg (DE); Bastian Mauerer, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 100 days.

(21) Appl. No.: 16/001,164

(22) Filed: Jun. 6, 2018

(65) Prior Publication Data
US 2018/0359054 A1 Dec. 13, 2018

(30) Foreign Application Priority Data
Jun. 7, 2017 (EP) ..................................... 17174752

(51) Int. Cl.
*H04L 1/00* (2006.01)
*G06F 7/58* (2006.01)
(Continued)

(52) U.S. Cl.
CPC ............ *H04L 1/0057* (2013.01); *G06F 7/584* (2013.01); *G06F 17/18* (2013.01); *G06N 7/005* (2013.01); *H03M 13/09* (2013.01); *H03M 13/091* (2013.01); *H03M 13/095* (2013.01); *H03M 13/3738* (2013.01); *H04L 1/0061* (2013.01)

(58) Field of Classification Search
None
See application file for complete search history.

(56) References Cited

U.S. PATENT DOCUMENTS 6,263,467 B1 * 7/2001 Hladik .............. H03M 13/2957
714/751
6,304,996 B1 * 10/2001 Van Stralen ...... H03M 13/2957
714/794
(Continued)

OTHER PUBLICATIONS

Unruh Jan et al: "Error Detection Analysis of Automotive Communication Protocols", SAE Special Publications, SAE Inc, US, pp. 43-52, XP001007280, ISSN: 0099-5908, the whole document; 1990.
(Continued)

*Primary Examiner* — Phung M Chung
(74) *Attorney, Agent, or Firm* — Cozen O'Connor

(57) ABSTRACT

A method for checking a signal transmission of a specified message with a number of d bits from a sender to a receiver by a control unit using a linear block code generated via a coding tool, a channel model, and a specified linear feedback shift register, which is parameterized via a generator polynomial, wherein the residual error probability of different Markov-modulated Bernoulli processes is calculated, where boundary conditions for signal transmission can be specified by using a characterizing Markov-modulated Bernoulli process and also a linear feedback shift register, where integration of the calculation of the residual error probability is performed in a dynamic, intelligent control circuit such that the respective residual error probabilities can be determined for different generator polynomials.

12 Claims, 4 Drawing Sheets

(51) Int. Cl.
  *G06F 17/18*    (2006.01)
  *H03M 13/09*    (2006.01)
  *G06N 7/00*     (2006.01)
  *H03M 13/37*    (2006.01)

(56) References Cited

U.S. PATENT DOCUMENTS 7,620,877 B2 * 11/2009 Vithanage ......... H03M 13/3905
                                                  714/780
8,941,472 B2 *  1/2015 Sadr .................... G06K 7/0008
                                                  340/10.3

OTHER PUBLICATIONS

Kuznetsov A et al: "On the Undetected Error Probability of Linear Block Codes on Channels with Memory", IEEE Transactions on Information Theory, IEEE Press, USA, vol. 42, No. 1, pp. 303-309, XP011026463, ISSN: 0018-9448, the whole document; 1996.

Schiller Frank et al: "Analysis of nested CRC with additional net data by means of stochastic automata for safety-critical communication", Factory Communication Systems, WFCS 2008. IEEE International Workshop on, IEEE, Piscataway, NJ, USA, pp. 295-304, XP031344895, ISBN: 978-1-4244-2349-1, Section I—Section III; 2008.

Merchant Kamal: "CRC-Test Einmal Ganz Anders Betrachtet Eine Methodik, Primär Ausgerichtet Auf Sicherheitsrelevante Systeme" Elektronik, W E K A Fachzeitschriften-Verlag GMBH, DE, vol. 52, No. 23, pp. 86-92, XP001177410, ISSN: 0013-5658, the whole document; 2003.

\* cited by examiner

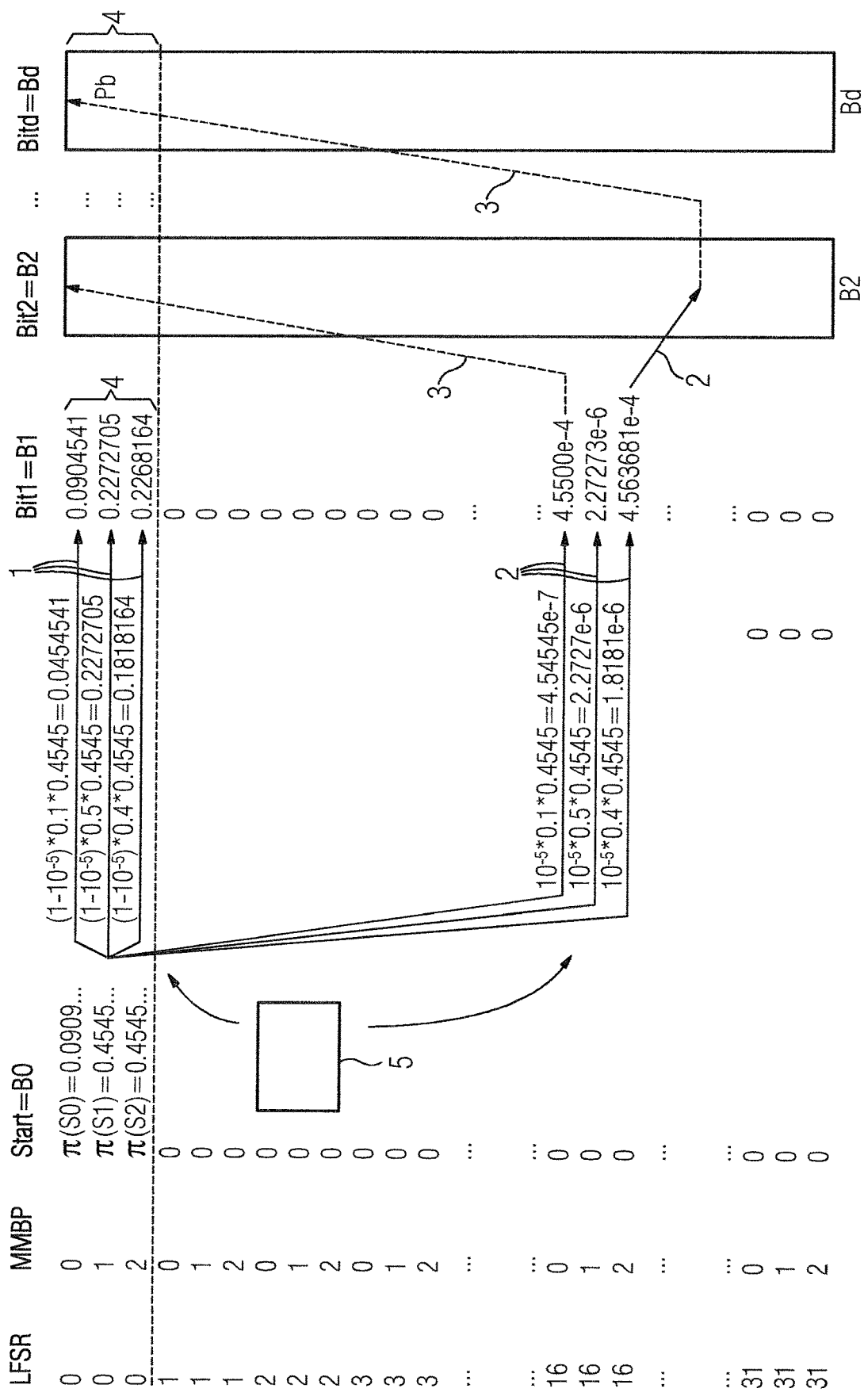

CHANNEL ADAPTIVE ERROR-DETECTING CODES WITH GUARANTEED RESIDUAL ERROR PROBABILITY

BACKGROUND OF THE INVENTION

1. Field of the Invention

The present invention relates to a method for checking a signal transmission of a specified message with a number of d bits from a sender to a receiver by a control unit using a linear block code, where the code is generated using a coding tool, a channel model, and a linear feedback shift register.

2. Description of the Related Art

In the transmission of messages or data via a channel from a sender to a receiver, errors in signal transmission can occur. In order to check a received message for correctness, error-detecting codes are often used. Such error-detecting codes are based, for example, on the conventional CRC method. The CRC method is a cyclic redundancy check to determine a check value of the message that has been transmitted. The calculation of this check value is based on a polynomial division. This CRC polynomial, also often known as the generator polynomial, can occur in various ways. The CRC method is designed to detect random errors. It is not suitable for correcting errors.

If a plurality of bits in the message and/or the check sum are simultaneously distorted, it can happen in rare cases that the CRC method in the receiver does not detect this error combination and that the message is erroneously accepted as correct. Error-detecting codes are never perfect and an absolutely error-free signal transmission cannot be guaranteed. Error patterns that cannot be detected can be generated for any code. The probability that an error will occur and will not be detected is known as residual error probability. Codes should preferably be constructed such that the residual error probability is as low as possible.

The residual error probability depends on a plurality of parameters. An important influencing factor relates to the properties of the channel used for signal transmission. Above all, here the frequency and distribution of bit errors is a key factor that influences the residual error probability. The length of the message and also the number of redundant bits likewise affect the residual error probability. In the present invention, the term "redundant bits" is primarily to be understood as a check sum. The way in which the redundant bits are calculated likewise affects the residual error probability. In CRC methods, this check sum is calculated via a generator polynomial. The selection of the generator polynomial therefore likewise affects the residual error probability.

Until now, the generator polynomial has been selected using deterministic criteria. These criteria are, for example, a minimum Hamming distance, a maximum length of bunches of errors that can be reliably detected, etc. These criteria can be determined in a relatively simple manner in the case of a specified code, and serve as a point of reference for a low residual error probability. It is therefore assumed, for example, that a great Hamming distance leads to a lower residual error probability. These criteria are merely qualitative points of reference and converse examples can be constructed, in which these qualitative criteria mistakenly present an incorrect residual error probability.

In this way, in the CRC method, bit errors in the message to be transmitted and further bit errors in the redundant bits, that is, in the check sum, can lead, for example, to a correct check value appearing when the CRC method is used. In this case, these errors would compensate each other. The CRC method would report the result that the message had been transmitted correctly although a plurality of bit errors had occurred. Accordingly, in other methods, specific counter-examples can likewise be constructed in which the criteria used until now with a certain probability do not detect a message that has been incorrectly transmitted.

Modern methods are therefore based on the direct calculation of the residual error probability. The residual error probability therefore quantifies the case where a message has been incorrectly transmitted and yet where at the same time this was incorrectly not discovered in the check. For calculating the residual error probability, an appropriate channel model must be defined, which describes the frequency and distribution of the bit errors.

Until now, in the prior art, only a simple channel model, the "binary symmetric channel model" (BSC model), has been used. This model is based on a constant bit error probability and assumes that the bit errors will occur independent of each other. These assumptions are, however, relatively unrealistic. For instance, the bit error probability can change if, for example, a system is used in different environments. For example, with a data cable, bit errors increasingly occur in signal transmission when there is a powerful heat source in the vicinity. This could be a welding process, for example. In this case, the probability of clusters of errors would increase. This means that the assumption of independent bit errors made in the BSC model would no longer apply in the example of the welding process.

Overall, it can therefore be ascertained that the BSC model for the most part only inadequately meets the needs of practice. Indeed, the binary symmetric channel model (BSC model) can be used to estimate the residual error probability, but this estimate often remains very conservative due to the aforementioned deficiencies.

Only the binary symmetric channel model has been used until now for calculating the residual error probability. Consequently, it can be assumed that there remains considerable potential for improvements in the calculation of the residual error probability in the more precise calculation thereof.

SUMMARY OF THE INVENTION

In view of the foregoing, it is an object of the present invention to determine a residual error probability more precisely in an error-detecting code.

This object and other objects and advantages are achieved in accordance with the present invention by a method for checking a signal transmission of a specified message with a number of d bits from a sender to a receiver by a control unit using a linear block code, where the code is generated using a coding tool, a channel model, and a linear feedback shift register. The coding tool can be formed as a linear feedback shift register or implemented as software. A linear block code is implemented by a linear feedback shift register, for example. The use of linear feedback shift registers is often encountered in the generation of linear block codes. The channel model is first described by a characterizing Markov-modulated Bernoulli process.

A Markov-modulated Bernoulli process can, for example, be represented by a status diagram with numerical values, in which diagram the various states, the respective transition probabilities, and the respective bit error probabilities are recorded. However, a representation in the form of a table is also possible, for example, using a transition matrix for the transition probabilities. A Markov-modulated Bernoulli process has a finite amount with N states. Each state i is allocated a respective bit error probability pi. With the aid of a stochastic N×N matrix, transition probabilities can be indicated showing the probability that a change of state from one state to another or to an identical state will ensue. The representation of this Markov-modulated Bernoulli process is generally more transparent as a state diagram.

Subsequently, a first iterative calculation of probability values is performed for a probability distribution of states of one of the d bits relating to a current bit after signal transmission by a signal transmission unit, starting from the current probability distribution of the states of the current bit, taking into account all the possible transitions that result from the Cartesian product of the number of states according to the specified Markov-modulated Bernoulli process and the number of states of the linear feedback shift register, with the control unit adding the probability values of transitions into an equal state and carrying out this iteration up to the probability distribution of the final bit. In the further course of this method, an iterative second calculation of probability values is performed for the probability distribution of the states of one of the d bits relating to a current bit after signal transmission by the signal transmission unit, starting from the current probability distribution of the states in the current bit, ignoring transitions out of a specified zero state, where the control unit adds the probability values of transitions into an equal state and performs this iteration up to the probability distribution of the final bit.

Subsequently, a difference is formed from the probability values of the specified zero state from the first iterative calculation with the probability values of the specified zero state from the second iterative calculation, where the difference represents the residual error probability.

These process steps make it possible to use various channel models in the calculation of the residual error probability. Channel models are suitable for describing the process of signal transmission. They are often explained with the aid of a state diagram. This usually contains details relating to the bit error probabilities and to the transition probabilities. It is, for instance, no longer necessary, for example, for the bit error probability to be constant, as is the case with the binary symmetric channel model (BSC model). Even different transition probabilities can be taken into account in the calculation of the residual error probability. By accordingly adjusting the Markov-modulated Bernoulli process or the specified zero state, the calculation of the residual error probability can be flexibly adjusted to a more realistic channel model.

In an alternative embodiment of the present invention, the iterative second calculation of the probability values for the probability distribution of the states of the final bit are achieved ignoring all transitions out of the specified zero state together with the first iterative calculation using local memory locations, which cache the results of the iterative calculation at least until the calculation of the residual error probability. This alternative method leads to the same result as the initially described embodiment of the method. With the present exemplary embodiment, the iterative calculation is not performed twice but local memory locations are created, in which the probability values of the specified zero state of the current bit are stored, where in this case all the transitions out of the specified zero state are ignored. The iterative first calculation is performed as described in the aforementioned, however. This embodiment of the present invention avoids a second separate iterative calculation by the control unit. Instead, however, the control unit creates local memory locations and calculates the probability values, which are cached in the local memory locations only for those transitions that begin in the zero state and remain there. By using these local memory locations instead of the second iterative calculation, advantages emerge with regard to the computation time or computing performance.

In an advantageous embodiment of the present invention, the linear feedback shift register, which is parameterized via a generator polynomial, is used as a coding tool. The linear feedback shift register has a specific length. This length influences the generator polynomial or the generator polynomial influences the specific length. Furthermore, generator polynomials with different lengths can likewise differ. With the aid of XOR switches placed in different locations, a different generator polynomial can be achieved. For example, depending on the arrangement of the XOR switches, in a linear feedback shift register of the length 3, the polynomial $x^3+x^2$ or the polynomial $x^3+x$ can be implemented. This can influence the generation of the linear block code and therefore signal transmission, too.

In a further embodiment of the present invention, a table with d+1 columns is generated at the start of the method, where the table is allocated with zeros, and the respective probability values are recorded in the columns of the table. In this case, the residual error probability is calculated via the table. Here, it is advantageous with respect to the calculations if the table has a pre-fixed size. This is achieved by the table being allocated zeros. However, instead of zeros, other numerical values or even letters can be used for the allocation.

The number of lines in the table depends not on the length of the message to be transmitted but on a length of the linear feedback shift register or on the number of states in the Markov-modulated Bernoulli process. This embodiment of the invention is particularly advantageous when it is desirable to reproduce the calculation of the residual error probability. In the context of learning purposes, it can be advisable to make part of the table visible. In this way, the calculation process can possibly be improved and also any errors can be more easily detected. This is easier to achieve with the table than it is when the method only issues the residual error probability as the final result.

In a further advantageous embodiment of the present invention, the specified channel model for different generator polynomials is used to calculate the residual error probability. Depending on the situation or the environment parameters, different generator polynomials can be considered for signal transmission. Here, it is very advantageous to know the respective residual error probability for different generator polynomials. Based on the residual error probability that has been calculated in this way, a good choice of a generator polynomial appropriate to requirements can be made.

In a further embodiment, the respective residual error probability is calculated for different channel models with the respective Markov-modulated Bernoulli process. If, for example, a plurality of channels are present, such as wireless transmission or wired signal transmission, then an appropriate channel model can be provided for each channel. In this embodiment, a respective residual error probability can be determined for the different channel models. Based on this calculation, an optimum channel can be selected for signal transmission.

In a further embodiment of the invention, the control unit holds in the memory in each case only two columns of the table at the same time to calculate the residual error probability. If a reproducibility of the calculation of the residual error probability is desired, then it is advisable to store a complete table. This involves, however, an increased memory and computational requirement. Only the current state is necessary for the calculation of the next state. As a result, it is possible to store only two columns of the table temporarily or keep them in the memory. Thus, for example, a third column can be calculated instead of a second column. In order to calculate a fourth column, only the data from the third column is necessary. In this example, the second column can now be deleted again.

In yet a further embodiment of the present invention, the generator polynomial is selected by a control circuit using the residual error probabilities. If for example, the external circumstances change during the running of the signal transmission, due to a rise in temperature, for example, this can lead to a change in the channel model and hence in the residual error probability. Here, a control circuit can make provision for the residual error probability for other generator polynomials to be determined by the control unit and for another generator polynomial to be selected for signal transmission on the basis of different residual error probabilities. In this way, it is possible to react in a flexible manner to changes in external circumstances that influence signal transmission. In this embodiment of the present invention, the calculation of the residual error probability is no longer static but is made dynamic.

In a further embodiment of the present invention, the selection of the respective generator polynomial is learnt. Here, the selection of the respective generator polynomial ensues independently and is continually improved. This means that the selection of the respective generator polynomial in increasingly performed in an intelligent manner. For instance, the method in accordance with the contemplated embodiments of the invention can be combined with a learning system, such as with an artificial intelligence. This allows a relevant generator polynomial to be adjusted independently by the control unit. In this embodiment, the control circuit described in the previous paragraph is capable of learning. The control circuit reacts to changing circumstances and can draw on experiences from the past to improve or accelerate the selection of an appropriate generator polynomial.

In a further embodiment of the present invention, a stationary distribution of the probability values for the specified zero state is established for the initialization of the iterative calculation. In order to start the iterative calculation, a probability distribution is provided for the calculation of the first step in the iteration. This probability distribution cannot consist of zeros alone because otherwise a probability distribution that deviates from zero cannot be calculated. Instead of this, a stationary probability distribution is assumed, which results when the specified Markov-modulated Bernoulli process is used for long enough, in the mathematical sense that is infinitely long. The calculation of this stationary distribution is not important, however, for the method in accordance with disclosed embodiments of the invention. It is merely necessary to use this stationary distribution of the probability values to initialize the iterative calculation.

The present invention also provides an apparatus for checking a signal transmission of a specified message with d bits from a sender to a receiver by a control unit that is configured to perform the method in accordance with disclosed embodiments of the invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further features of the invention will emerge from the claims, the figures and the description of the figures. The features and combinations of features referred to in the aforementioned and also the features and combinations of features referred to hereinafter in the description of the figures and/or features and combinations of features shown in the figures alone are not usable in the respective combination shown, but also in other combinations without going beyond the scope of the invention.

Various exemplary embodiments of the present invention are described below. These are now explained in greater detail with reference to the attached drawing, in which:

FIG. 4 shows an example of a table with a transition from an incorrect state back to the specified zero state in accordance with the invention.

DETAILED DESCRIPTION OF THE EXEMPLARY EMBODIMENTS

Figure 1:
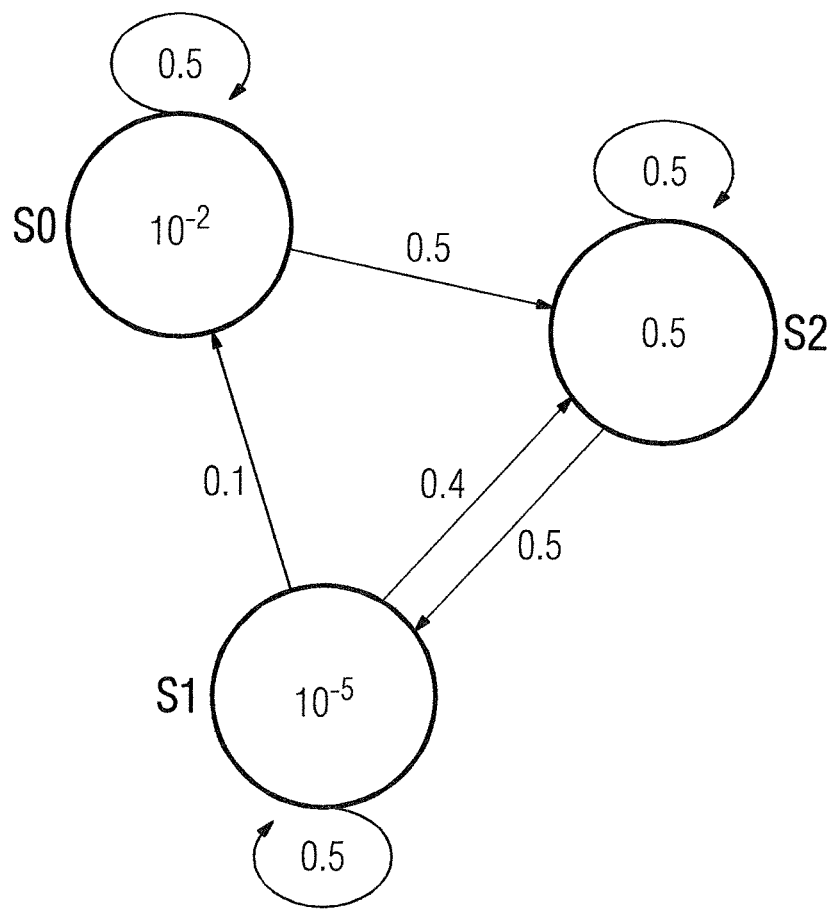
FIG. 1 shows a numerical example of a Markov chain with the states S0, S1 and S2 and also the relevant transition probabilities and bit error probabilities for describing the characterizing Markov-modulated Bernoulli process.

FIG. 1 shows by way of example a Markov chain with the states S0, S1 and S2. These states are shown by black circles. Within these states, a numerical value is recorded in each case. This numerical value represents the respective bit error probability in the respective state. For instance, in this case, the state S1 has a relatively low bit error probability amounting to $p1=10^{\wedge}(-5)$, while on the other hand, in the state S2, the bit error probability is $p2=0.5$. These three exemplary states S0, S1, and S2 are linked by transition probabilities. The possible transitions of the states are indicated by the respective arrows and the directions in which they point. The relevant figure indicates the respective transition probability. For instance, the state S1 has three transition probabilities. With a probability of 0.1, the state S1 changes into the state S0, with a probability of 0.4, starting from the state S1, the state S2 is adopted. When in the state S1, the probability of remaining in the state S1 is 0.5. These bit error probabilities can also be represented in the form of a vector, for example. In the same way, the transition probabilities can also be represented in the form of a matrix. The bit error probabilities and transition probabilities recorded in FIG. 1 are valid for the subsequent examples of calculations.

Before starting on the calculation of the residual error probability, a zero state 4 must first be defined. Here, the zero state 4 has as many possible variations as there are states for the Markov-modulated Bernoulli process. For the Markov-modulated Bernoulli process shown by way of example in FIG. 1, the number of different states is three. Therefore, the specified zero state 4 has three states.

The message is sent through the linear feedback shift register during signal transmission. As a result, a length S of the linear feedback shift register determines the possible variations thereof. The length S of the linear feedback shift register emerges from the highest degree of generator polynomial that is used. The linear feedback shift register represents an implementation of a polynomial division and is designed such that a figure one appears where there is a bit error at a relevant point. If there is no transmission error, then all the points in the linear feedback shift register show the value zero. This is the specified zero state 4.

In this example, the linear feedback shift register has five points and therefore has at its disposal $2^5$, i.e., 32 possible variations. This is due to the fact that each point in the shift register can be occupied by a zero or a one. Furthermore, these states in the linear shift register can occur for every state in the Markov-modulated Bernoulli process. Therefore, in this example, the total number of states that have to be taken into account by a control unit 5 for calculating the residual error probability is 32×3=96.

The control unit 5 can be formed as a microchip, microprocessor, programmable logic control (PLC), or as a computer. In accordance with the method of the invention, the control unit determines the residual error probability in a signal transmission based on a selected channel model.

Figure 2:
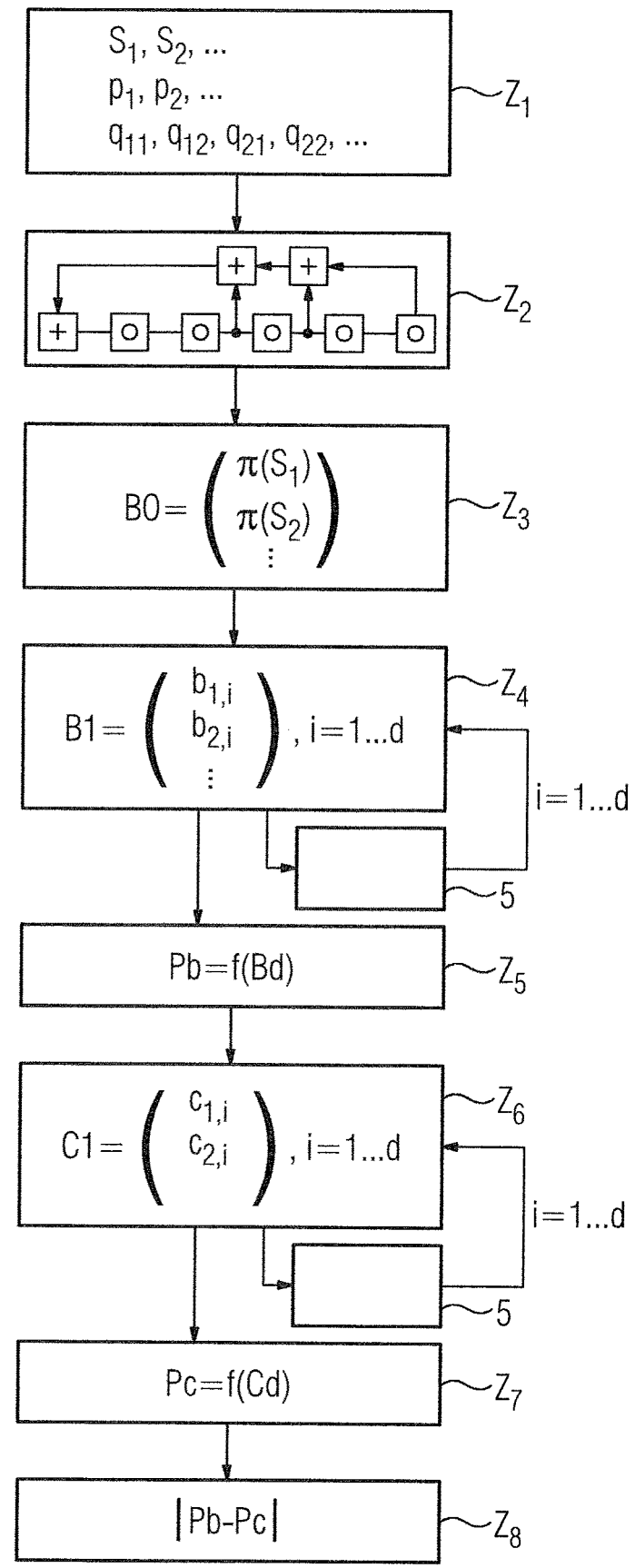
FIG. 2 shows a flow diagram to show the process steps for calculating the residual error probability in accordance with the invention.

The individual process steps are shown by way of example in a flow diagram in FIG. 2. First, a starting position is defined in step Z1. This includes the data contained in FIG. 1, i.e., the number of different states S0, S1, S2, the bit error probabilities p1, p2, p3, and also the relevant transition probabilities q11, q12, etc. In the next step Z2, a suitable linear feedback shift register is defined. The length S of this linear feedback shift register emerges from the highest polynomial level of the generator polynomial used. In this example, the linear feedback shift register in step Z2 has five points. With aid of the linear feedback shift register, a polynomial division can be implemented in combination with the XOR switches marked in step Z2. For the present invention it is not necessary, however, to understand how this polynomial division is performed. What is important is that, with the aid of the linear feedback shift register and also of the number of states in the Markov-modulated Bernoulli process, the number of all the possible states of the respective bits in the signal transmission can be calculated, which number the control unit 5 then takes into account in the calculation method for the residual error probability.

In step Z3, a stationary probability distribution for these 96 states is defined. In this example, B0 is a vector that comprises one column and 96 lines. The first three lines in this example characterize the specified zero state 4. There is indeed only one zero state 4 in the linear shift register, but there are three states in the Markov-modulated Bernoulli process. The zero state 4 therefore comprises three entries in total. Probability values are entered therein during the method. In the vector B0, these first three lines, which represent the zero state 4, contain the specified stationary probability distribution. The calculation of this stationary probability distribution ensues based on a stochastic calculation, which is not part of this invention disclosure, however.

For all further remaining states, the value zero is entered in step Z3. This means that, from the fourth line to the last line, the vector B0 does not contain any entries or only zeros. This vector B0, which can be understood as the first column in a table, describes the state in which the message is before transmission. There is no assumption that an error is already present before the transmission of the message, i.e., that an incorrect message is involved. Consequently, the vector B0 comprises only zeros from the fourth line on.

In step Z4, the first iterative calculation begins. Based on the stationary probability distribution in the vector B0, the control unit 5 determines all possible transitions and calculates the probabilities thereof in accordance with the method of the invention. The bit error probabilities and transition probabilities necessary for this are specified by the Markov-modulated Bernoulli process according to FIG. 1. Through this iterative calculation in step Z4, new vectors or columns Bi are generated that indicate probability values for the possible states in the signal transmission.

Here, each column indicates what the probability distribution is up to the respective bit. If one considers a seventh column for example, the probability values then indicate how the message would have been transmitted had the message been seven bits long. Here, the column total is always one, with the exception of any rounding errors.

Here, the control unit 5 adds the probability values of different transitions that culminate in an equal state. This iterative calculation is performed up to the vector Bd or to the column Bd. In step Z4, the final column in this iterative calculation method contains a probability distribution Pb for the message that was transmitted in the zero state 4. These probability values are temporarily cached in step Z5.

In step Z6, a similar iterative calculation to that in step Z4 is performed. In this second iterative calculation method, however, the control unit 5 only takes into account those transitions that start in the specified zero state 4 and that do not lead out of this zero state 4. Thus, in each step, the control unit 5 calculates a probability distribution that is usually different from that in step Z4. The message is d bits long. Consequently, d vectors of Ci are likewise calculated (C1, C2, . . . , Cd), as in the first iteration. What are important for the next step for calculating the residual error probability are the respective final vectors Bd and Cd. Of these vectors in turn, only the first three entries are important since these characterize the zero state 4. These three lines contain the probability values for a transmission that is correctly displayed by the linear feedback shift register. The vector Bd, however, includes those transmissions from error states back into the zero state 4. It is precisely these transitions that it is important to quantify as the residual error probability.

In a step Z7, the control unit 5 extracts the probability values of the specified zero state 4 in the final vector calculated or in the final column calculated by both iterative calculation methods (Z4, Z6).

The control unit 5 has not taken all the transitions into account in the iterative calculation in step Z6, however. As a result, the calculated probability distribution Pc in step Z7 is different from the probability distribution Pb in step Z5. In step Z8, the residual error probability is established by forming the difference between the probability values in step Z7 and those in step Z5. For this purpose, the control unit 5 can perform, for example, the following arithmetic operation Bd-Cd, with only the first three entries being taken into account.

Figure 3:
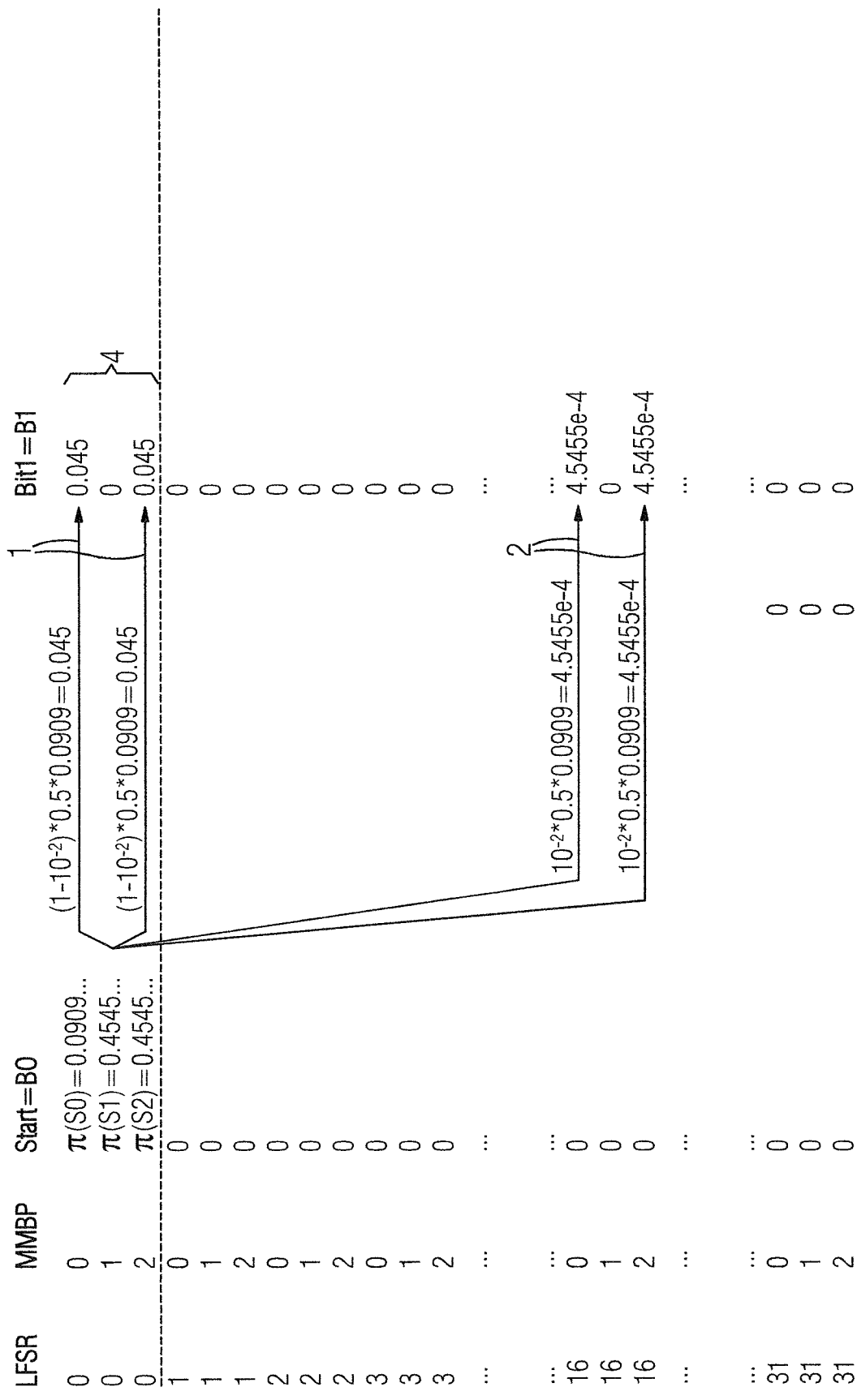
FIG. 3 shows an example of a table with transitions out of the specified zero state in accordance with the invention.

In order to better illustrate the calculation of the residual error probability, in FIG. 3 a table with transitions out of the state S0 is shown. The first two columns LFSR and also MMBP are not absolutely necessary for the calculation of the residual error probability, yet these two columns illustrate the number of all the possible states in the signal transmission. In this example, the linear feedback shift register has the length S of five bits, and therefore 32 possible variations exist within the linear feedback shift register. In each case, a bit can only assume the states zero or one. As a result, there are two possibilities for each point in the linear feedback shift register. If the linear feedback shift register has five points, then there are accordingly $2\^S=32$ possibilities.

In this example, the counting of all these 32 possibilities begins at zero. Consequently, the final entries in the first (LFSR) column are 31. The Markov-modulated Bernoulli process of FIG. 1 has three states (S0, S1, and S2). Consequently, each state in the linear feedback shift register has three states. This results in total in $2\^5\times3=96$ possible variations for the signal transmission, which the control unit 5 takes into account.

First, for the initialization, a stationary probability distribution is recorded in the third column of FIG. 3. This column, which is marked B0, corresponds to step Z3 from FIG. 2. This column only comprises zeros from the fourth line. This is due to the fact that an error is not already assumed in the initialization. The first three lines of the table in FIG. 3 represent the specified zero state 4. In this specified zero state 4, the linear feedback shift register comprises only zeros. In the event of a transmission error, a one appears in the linear feedback shift register instead of a zero. The zero state 4 therefore shows a supposedly correctly transmitting message. All the further states indicate an error in signal transmission. Here, these errors are, however, detected as such, because the linear feedback shift register deviates from the zero state 4.

According to the stationary probability distribution, the state S0 exists with a probability of around 0.09. According to the properties in the Markov-modulated Bernoulli process, the probability values for a correct transmission 1 can be read off. According to FIG. 1, in this example, two transitions out of the state S0 are specified each with a probability of 0.5. The probability values for the correct transmissions 1 are determined. As a result, it is not the bit error probability that is used but the relevant converse probability. Therefore, in this example, the probability that the bit 1 is transmitted in the zero state 4 from the state S0 into the state S2 $(1-10\^(-2))*0.5*0.0909$ is calculated at around 0.045.

Alongside the probability values for the correct transmissions 1, there are also probability values for incorrect transmissions 2. These probability values are calculated in a similar way to that used in the case of the correct transmission 1, with the difference being that the respective bit error probability pi and not the converse event is used for the calculation. The state S0 has a bit error probability of $10\^-(2)$, for the exemplary incorrect transmissions 2. Consequently, the result is probability values that are reduced accordingly $(10\^(-2)*0.5*0.0909)$.

FIG. 4 shows an exemplary table indicating how the further progression of the method is continued by the control unit 5. A total of six transitions out of the state S1 are possible. Three transitions result in each case for the correct transmissions 1 within the zero state 4, and there are a further three transitions resulting for the incorrect transmissions 2 that lead out of the zero state 4. The calculation of the probability values shown by way of example in FIG. 4 ensues in a similar way to that in FIG. 3. FIG. 4 shows, by way of example, that for the transition out of the state S1 for the stationary distribution (column B0) into the state S0 of the bit 1, the probability is 0.045. In column B1, the state S0 can be achieved by various transitions. As a result, there are a plurality of probabilities that the state S0 is reached with bit 1. These probability values for the various transitions into the state S0 from the bit 1 are added together by the control unit 5.

This method is now successively continued by the control unit 5 until the probability values of all the possible transitions have been taken into account up to the final column. In this case, column B0 comprises many zeros. Consequently, the iterative calculation for this column already ends once the third column has been completed. FIG. 3 and FIG. 4 show an extract from the calculation by the control unit 5, merely by way of example.

If the calculation of the probability values is performed for the column B1, then the probability values for the next column, which represents the bit 2 or the column/the vector B2, are performed using the same calculation method. The values for the transition probabilities and the bit error probabilities result from the characterizing Markov-modulated Bernoulli process of FIG. 1. In FIG. 4, two further columns B2 and Bd are indicated, by way of example, with transitions out of the state LFSR 16 and MMBP 0 back into the zero state 4. This pathway represents an incorrect undetected signal transmission 3 because it leads back into the zero state 4, which signals the correct transmission 1.

In the first iterative calculation, these transitions out of incorrect and undetected signal transmissions 3 are taken into account. These signal transmission pathways increase the probability values of the zero state 4. The probability values for the zero state 4 therefore also contain the cases of incorrect and undetected signal transmissions 3. Here, there is an error in signal transmission that has not been detected. All the probability values outside the zero state 4 likewise represent errors in the signal transmission. Yet, these errors can be detected because the linear feedback shift register comprises at least one figure one, which indicates an error in signal transmission.

If, starting from the stationary state S1, the bit 1 is incorrectly transmitted and if, based on this incorrect state, a transmission back into the zero state 4 occurs, then an error has occurred in signal transmission, which has not been detected and which leads to an increase in the probability values in the zero state 4. The probability values of the zero state 4 therefore contain the residual error probability. To extract this therefrom, the control unit 5 goes on to perform the second iterative calculation.

The control unit 5 now performs this second iterative calculation up to column Bd, which represents the message being transmitted. However, in the second iterative calculation, all the transitions that lead from the zero state 4 are ignored. This usually results in different probability values for the zero state 4 in the course of the second iterative calculation that is performed. This second iterative calculation is performed by the control unit 5 up to the final column Bd. Hence, the probability values Pc for the states of the message that has been transmitted in the zero state 4 emerge in the final column Bd without the incorrect and undetected signal transmissions.

The probability values Pb for the final column Bd of the zero state 4 likewise contain the probability values for the incorrect and undetected signal transmission 3. The probability values Pb have been implemented in the first iterative calculation and all possible transitions have been taken into account. In order to extract the probability values for these incorrect and undetected signal transmissions 3, the control unit 5 forms the difference between the probability distributions Pb and Pc, with only the entries for the zero state being taken into account.

In this example, three probability values for Pb emerge for the signal transmission out of the first iterative calculation and a further three probability values for Pc emerge out of the second iterative calculation. The control unit now forms the difference Pb-Pc, which gives the residual error probability. In other words, the difference between the vectors Bd and Cd is formed, with only the first three lines being taken into account in this case.

The exemplary methods shown in FIG. 3 and in FIG. 4 can also be performed in a different way, however. Instead of a second iterative calculation, an additional variable can be introduced, which caches the probability values of transitions that begin in the zero state 4 and remain there.

Depending on the Markov-modulated Bernoulli process that is specified, the control unit 5 can calculate the residual error probability for different generator polynomials. Here, provision can be made that, out of a plurality of different generator polynomials, the one that has the lowest residual error probability is selected. The selection of different generator polynomials can be performed at regular or even at irregular intervals.

This automatic selection is now explained by way of example on a motor vehicle with an air conditioning unit. Modern motor vehicles usually have an air conditioning unit and also the relevant temperature sensors. In this example, the motor vehicle is intended to have a temperature sensor for the external temperature and a further temperature sensor for the inside temperature. These temperature values measured in this way are transmitted by the control unit 5 to the air conditioning unit. Using the transmitted temperature values, the air conditioning unit increases or reduces its cooling capacity.

If the vehicle is, for example, used in Central Europe at moderate temperatures, then a specific channel model for signal transmission can be provided for this purpose. The same vehicle is now intended to be used in a hot environment, such as in a desert. This means the ambient conditions change. The bit error probabilities will presumably increase and the probability values for the transition matrix may also change due to the change in the vehicle's location. In other words, the exemplary Markov-modulated Bernoulli process that is shown in FIG. 1 changes.

With the method in accordance with the invention, the residual error probability of other generator polynomials in the new environment can now be calculated. The result may be that a different generator polynomial from the one that was used for the Central European region is better suited for signal transmission in the desert.

Furthermore, the method in accordance with the invention can be integrated into an intelligent control circuit, which can calculate the residual error probability afresh where there are changes in the environmental parameters and which automatically selects a better generator polynomial based on the residual error probabilities that have been calculated in this way. Here, in particular, provision can likewise be made for the aforementioned control circuit to learn the selection of a suitable generator polynomial and constantly improve this polynomial.

Such a dynamic control circuit may include different components. An analysis component, which determines the frequency and the distribution of bit errors, can be provided. This can come about, example, by regularly transmitting a known message.

A Bernoulli-generator could parameterize a suitable Markov-modulated Bernoulli process, i.e., equip it with states, transitions, and probability values. This corresponds to the "learning problem" from the field of "Hidden Markov Models". Common algorithms for solving this problem are the Baum-Welch algorithm and the Baldi-Chauvin algorithm. The mathematical effort involved is low because the Markov-modulated Bernoulli process has only few states at its disposal. In the Gilbert-Elliot model there are only two states, for example.

The control unit 5 can now calculate the residual error probabilities of all the relevant codes in accordance with the method of the invention. These codes may differ, for example, in the generator polynomials or in the code-word lengths.

A selection component can be used to select a generator polynomial. This selection component should be reconciled with the communication partners, such as with the sender and the receiver, in order to achieve a simultaneous exchange of the code used. With the analysis component, the Bernoulli-generator, the control unit 5, and also with the selection component, a dynamic system can be created that selects the best available generator polynomial as required. Usually, this will be the generator polynomial with the lowest residual error probability.

In the example of the vehicle with the air conditioning unit, changes in the environmental parameters can be triggered not only by a change in location but also, for example, when the air conditioning unit is incorporated into various types of vehicle. Thus, for example, the same air conditioning unit in an Audi may have a different Markov-modulated Bernoulli process from the same air conditioning unit fitted in a Porsche, for example. In the Porsche there may be different cables provided for signal transmission, a battery could generate interference fields, which affects signal transmission. These are a few examples of why different generator polynomials need to be used in the same air conditioning unit in different vehicles.

The residual error probability is an important criterion for a reliable signal transmission and this has only been determined until now via the rigid BSC model. With the method in accordance with the invention, which can be combined with an intelligent dynamic control circuit, the control unit 5 can determine from a selection of different generator polynomials those generator polynomials for signal transmission that have a residual error probability that is as low as possible.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for checking a signal transmission of a specified message with a number of d bits from a sender to a receiver by a control unit such that a speed at which a residual error probability is calculated and an accuracy of the calculated residual error probability utilizing a linear block code created via a coding tool, a channel model, and a linear feedback shift register are increased, the method comprising:
   describing the channel model via a characterizing Markov-modulated Bernoulli process;
   performing an iterative first calculation of probability values for a probability distribution of states of one of the d bits relative to a current bit after transmission of a signal by a signal transmission unit, starting from a current probability distribution of states in the current bit, taking into account all possible transitions that result from a Cartesian product of a number of states in accordance with the Markov-modulated Bernoulli process and the number of states of the linear feedback shift register, the control unit adding probability values of transitions into an equal state and performing this iteration up to a probability distribution of a final bit;
   performing an iterative second calculation of probability values for the probability distribution of the states of one of the d bits relative to the current bit after transmission of the signal by the signal transmission unit, starting from the current probability distribution of the states in the current bit, ignoring all transitions obtained during a specified zero state, the control unit adding the probability values of transitions into an equal state and performing this iteration up to the probability distribution of the final bit; and
   forming a difference from the probability values of a specified zero state obtained during the first iterative calculation with the probability values of the specified zero state obtained during the second iterative calculation, as the residual error probability having the increased accuracy.

2. The method as claimed in claim 1, wherein the iterative second calculation of the probability values for the probability distribution of the states of the final bit, ignoring all the transitions out of the specified zero state, occurs together with the first iterative calculation, using local memory locations, which cache results of the iterative calculation at least up to the calculation of the residual error probability.

3. The method as claimed in claim 1, wherein the linear feedback shift register, which is parameterized via a generator polynomial, is used as a coding tool.

4. The method as claimed in claim 3, wherein different generator polynomials are utilized in a specified channel model to calculate the residual error probability.

5. The method as claimed in claim 3, wherein the generator polynomial is selected by a control circuit based on residual error probabilities.

6. The method as claimed in claim 5, wherein selection of the respective generator polynomial is learnt.

7. The method as claimed in one claim 1, wherein a table with d+1 columns is generated at a start of the method, said table being allocated zeros; and wherein respective probability values are recorded in the columns.

8. The method as claimed in claim 7, wherein different generator polynomials are utilized in a specified channel model to calculate the residual error probability.

9. The method as claimed in claim 7, wherein the control unit in each case holds in the memory only two columns of the table to calculate the residual error probability.

10. The method as claimed in claim 1, wherein the respective residual error probability is calculated for different channel models with a respective Markov-modulated Bernoulli process.

11. The method as claimed in claim 1, wherein a stationary distribution of the probability values for the specified zero state is calculated for initialization of the iterative calculation.

12. An apparatus for checking a signal transmission of a specified message with d bits from a sender to a receiver by a control unit, said apparatus having an increased speed at which a residual error probability is calculated and an increased accuracy of the calculated residual error probability, the apparatus comprising:
   a processor; and
   memory;
   wherein the processor of the apparatus:
      describes a channel model via a characterizing Markov-modulated Bernoulli process;
      performs an iterative first calculation of probability values for a probability distribution of states of one of the d bits relative to a current bit after transmission of a signal by a signal transmission unit, starting from a current probability distribution of states in the current bit, taking into account all possible transitions that result from a Cartesian product of a number of states in accordance with the Markov-modulated Bernoulli process and the number of states of the linear feedback shift register, the control unit adding probability values of transitions into an equal state and performing this iteration up to a probability distribution of a final bit;
      performs an iterative second calculation of probability values for the probability distribution of the states of one of the d bits relative to the current bit after transmission of the signal by the signal transmission unit, starting from the current probability distribution of the states in the current bit, ignoring all transitions obtained during a specified zero state, the control unit adding the probability values of transitions into an equal state and performing this iteration up to the probability distribution of the final bit; and
      forms a difference from the probability values of a specified zero state obtained during the first iterative calculation with the probability values of the specified zero state obtained during the second iterative calculation, as the residual error probability having the increased accuracy.

\* \* \* \* \*